Figure 1:
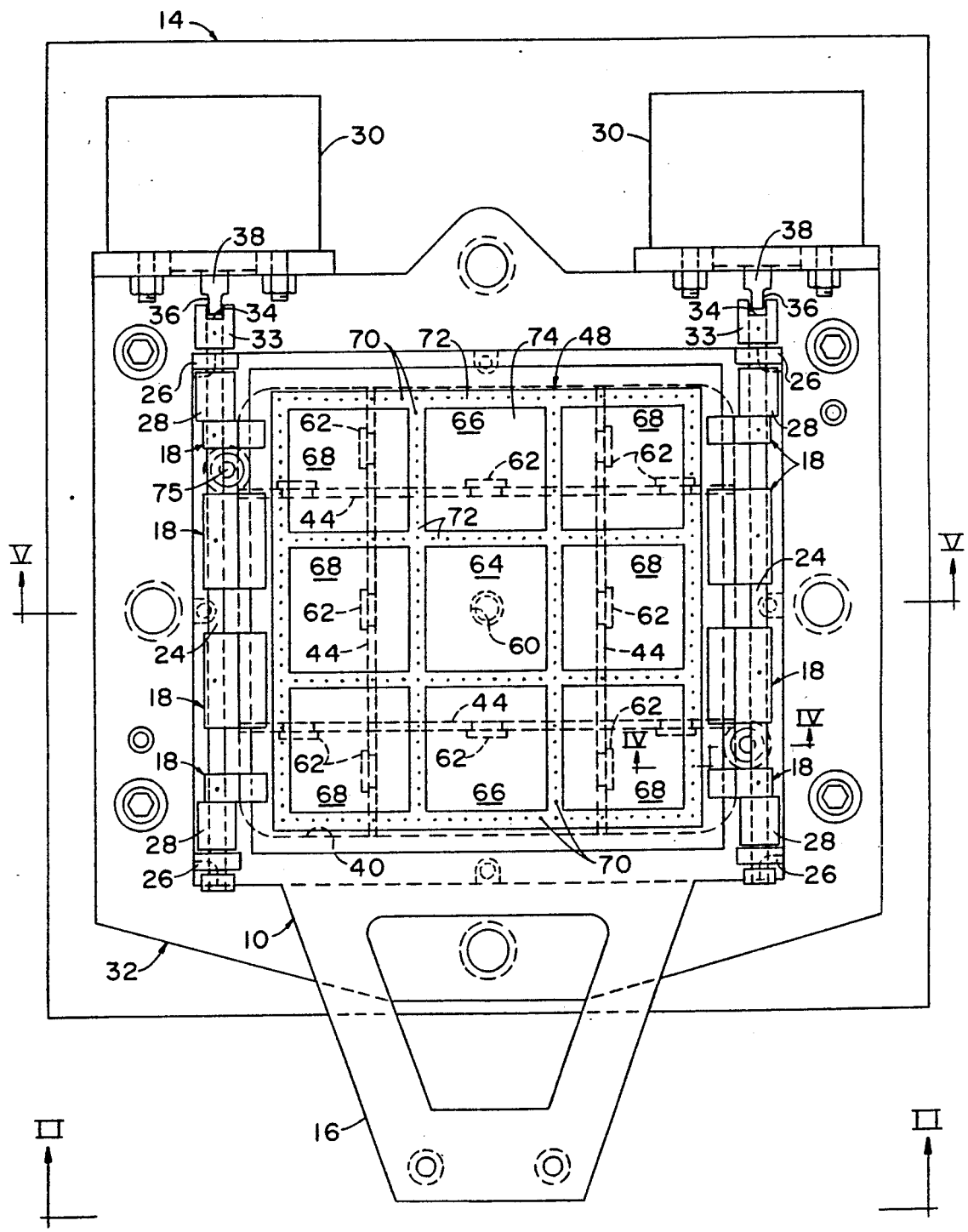

United States Patent [19]

Miller

[11] Patent Number: 5,053,183
[45] Date of Patent: Oct. 1, 1991

[54] METHOD OF HANDLING GREEN CERAMIC CARDS

[75] Inventor: James A. Miller, Apollo, Pa.

[73] Assignee: Aluminum Company of America, Pittsburgh, Pa.

[21] Appl. No.: 410,412

[22] Filed: Sep. 21, 1989

[51] Int. Cl.$^5$ .............................................. B65H 9/08
[52] U.S. Cl. ..................................... 264/547; 264/553
[58] Field of Search ............... 264/553, 504, 547, 544, 264/571; 425/388

[56] References Cited

U.S. PATENT DOCUMENTS 4,761,257  8/1988  Bunn .................................. 264/46.5

Primary Examiner—James Lowe
Assistant Examiner—Christopher A. Fiorilla
Attorney, Agent, or Firm—Elroy Strickland

[57] ABSTRACT

A method of handling a fragile, flexible card on a perforated plate. The method includes first locating the card on a tray having an open center, and disposing the tray and card on the plate. The plate is located on a hollow platen which is evacuated to draw the card to the plate. The hollow of the platen has a center compartment and peripheral compartments located about the center compartment. The evacuation process begins with the center compartment and gradually evacuates the peripheral compartments such that the center portion of the card is drawn first to the periphery plate while the peripheral portions of the card are drawn later to the periphery of the plate. In this manner, the drawing process begins with the center of the card and progresses outwardly from the center to the periphery of the card. After the card is drawn to the plate, the card is secured to the open tray by clamps.

2 Claims, 5 Drawing Sheets

METHOD OF HANDLING GREEN CERAMIC CARDS

BACKGROUND OF THE INVENTION

The present invention relates generally to apparatus for automatically handling green ceramic cards or other types of fragile materials in the form of sheets or cards, which apparatus includes a carrier device for receiving and transporting the cards in a flat, planar manner, and in a manner that does not tear or otherwise harm the cards.

Pin grid array interconnect devices for the computer industry are made from what is generally known as green ceramic cards. The term "green" refers to unfired ceramic bodies. The cards are cut from a flexible, fragile green ceramic tape. The tape is cast from a slip or slurry of material contained in a hopper. The slip material is a mixture of ceramic powders, organic binders and solvents. In forming the tape, a wet film of the slip mixture is cast on a supporting strip by a method known as "doctor blading". The wet film dries on the supporting strip to form the green tape before it is subject to further handling.

Generally it has been a practice in the industry to manually handle and transfer the green cards after they are cut or blanked from the fragile tape. This has required a substantial number of people, as the tape was manually slit and cut with knives to form each card, and manually supplied to shuttles or other conveying devices for feeding a blanking press to make the cards. After the cutting or blanking process the cards were manually stacked for further processing in the overall manufacture of the packaging modules. On the occasions of using a frame to support and transfer cards, each card was manually secured to the frame with tape to maintain the card in a flat condition on the frame.

It is necessary that the green cards be smooth and flat. In making the interconnect devices, a plurality of the cards are first stacked together and then co-fired in a multi-layer process. The firing changes the layered cards into a monolithic structure and substrate. To insure the integrity of the process and resulting substrate, the green cards need to be flat so that they lie in intimate contact with each other.

Because the production process has been essentially manual, production losses and costs were high. This was due to the fact that the material of the green ceramic tape and cards is fragile, as it is easily contaminated, broken and torn. In addition, the tape is abrasive, requiring personnel to wear gloves to protect their hands. Gloves are also needed to maintain the tapes and blanks free of fingerprints.

BRIEF SUMMARY OF THE INVENTION

The present invention is directed to the elimination of manual handling of green ceramic cards and to apparatus for receiving, flattening and transferring such cards from one workstation to a next workstation or location in a manner that does not bend and/or tear the cards such that each card arrives at the next workstation in an unharmed state ready for further processing.

THE DRAWINGS

Figure 2:
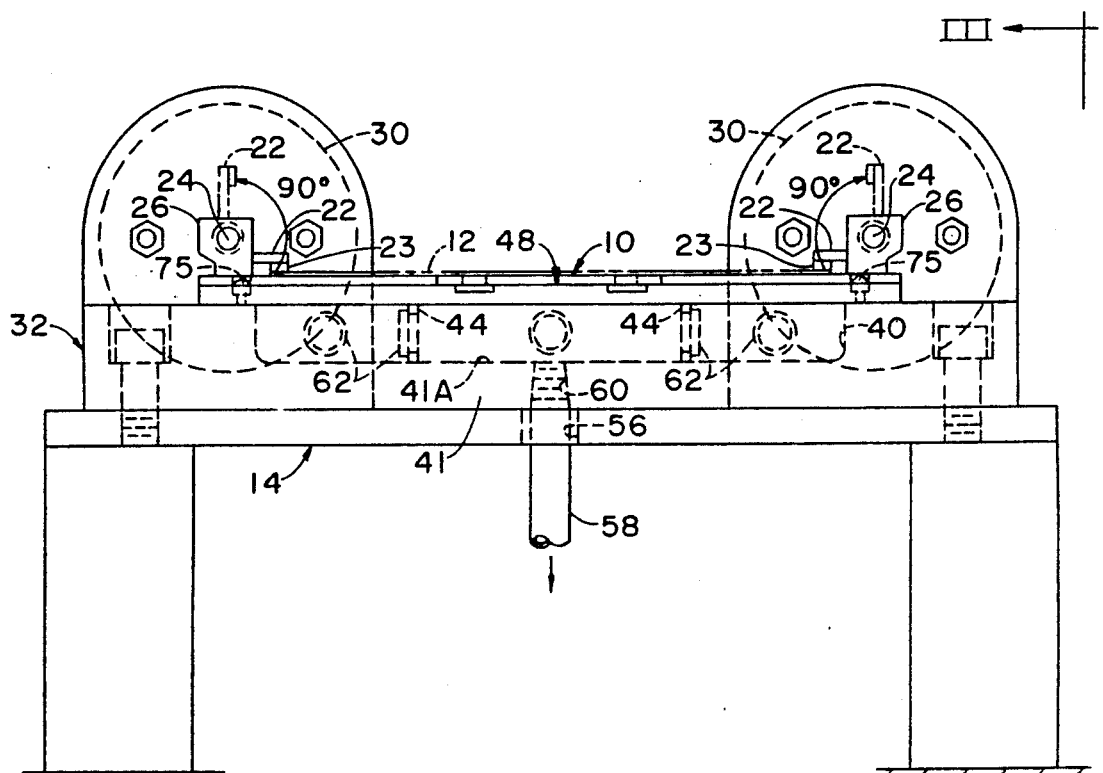
Figure 5:
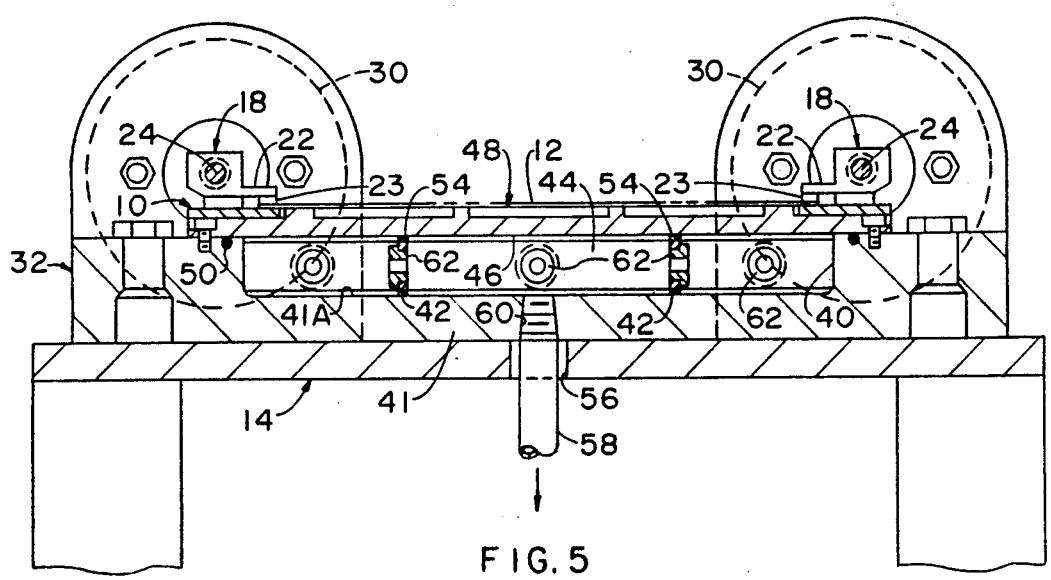
Figure 3:
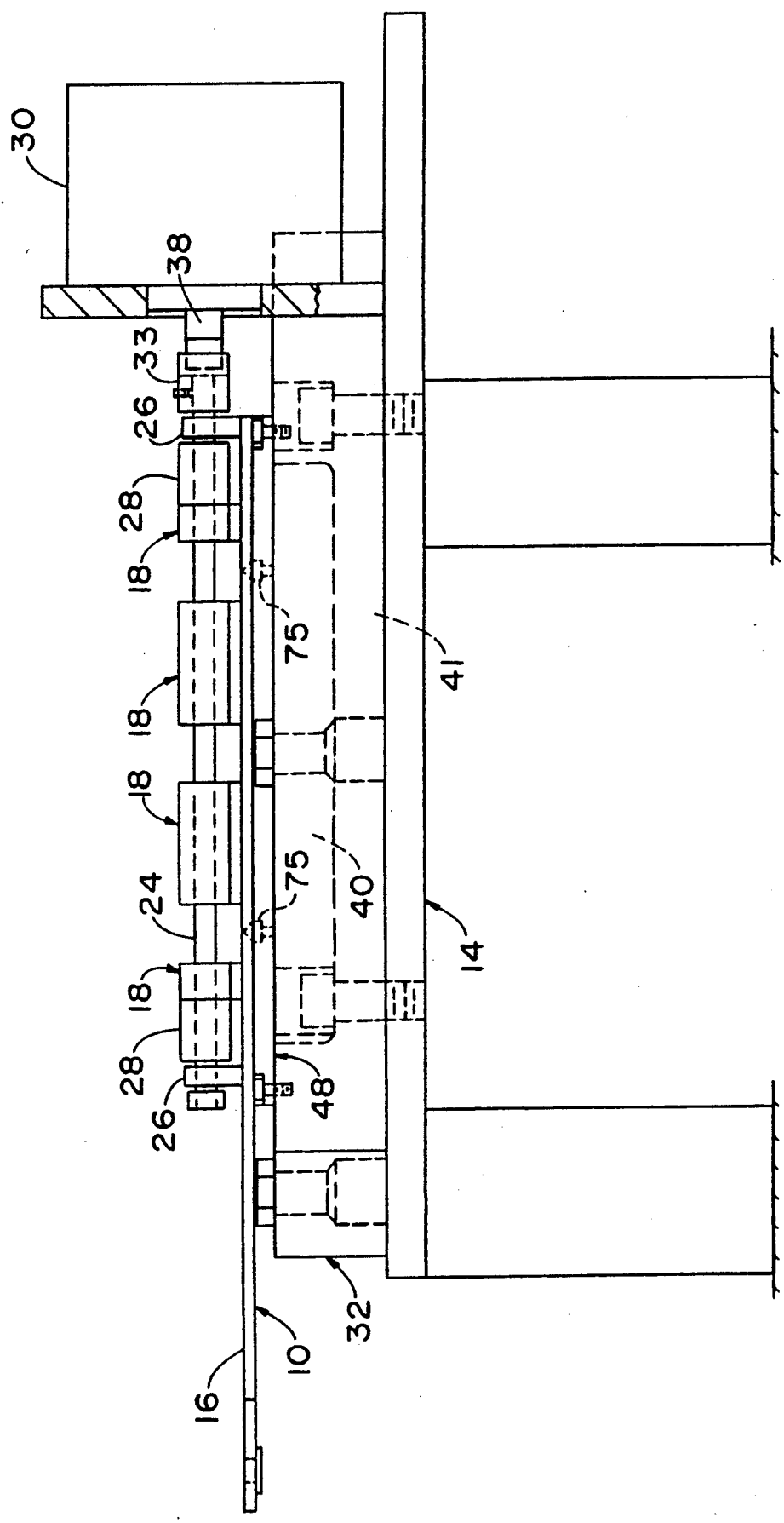
Figure 4:
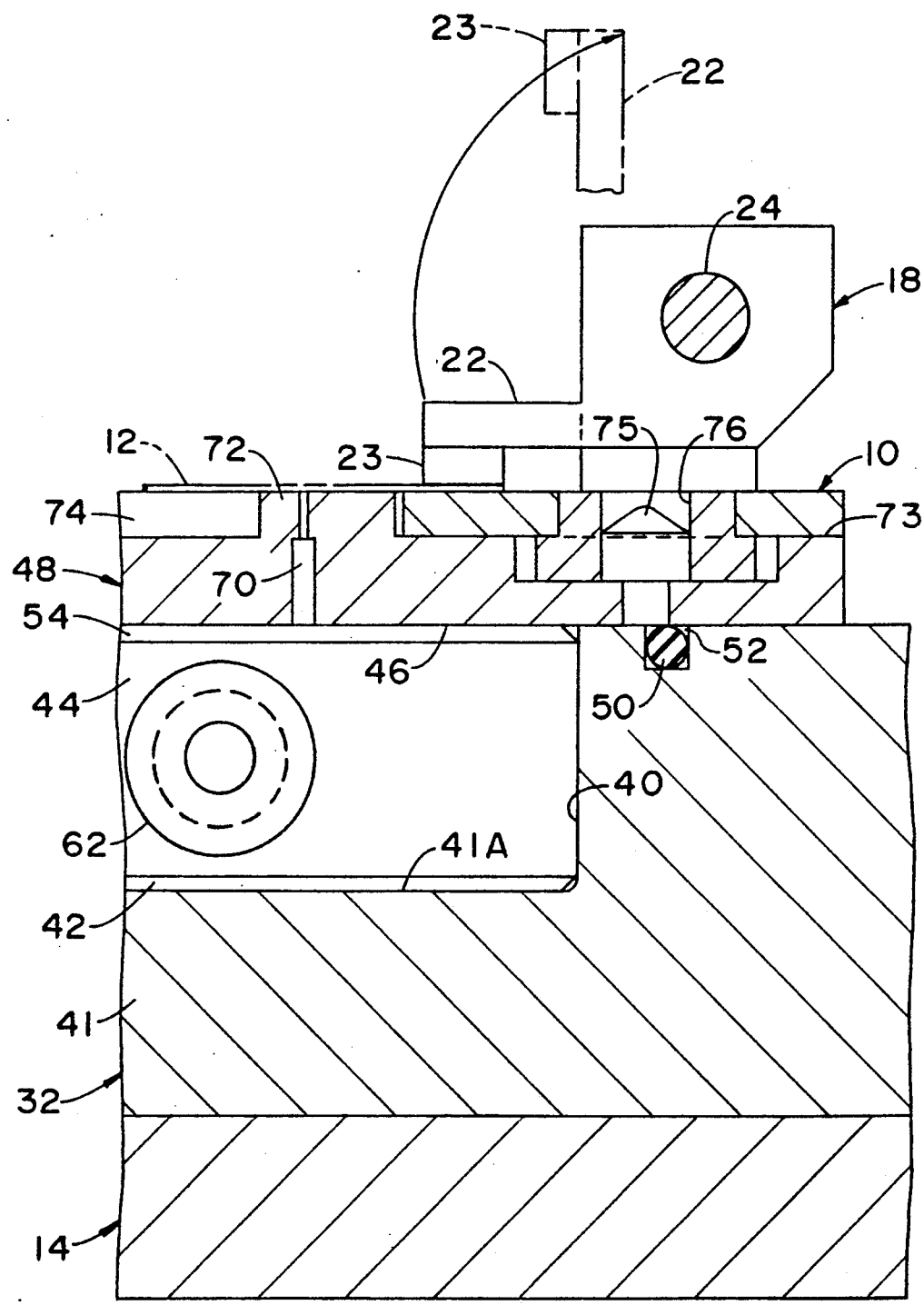
Figure 6:
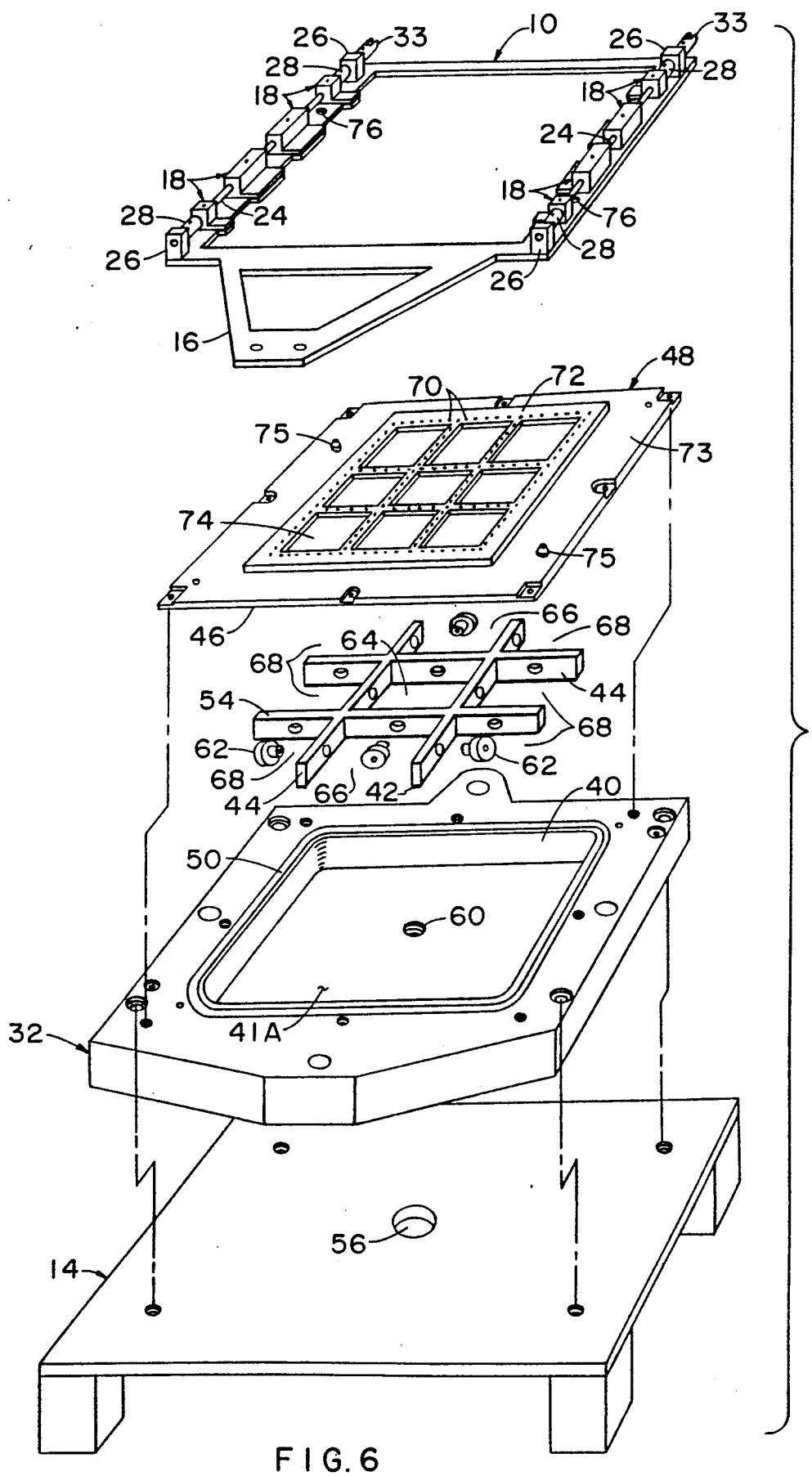

The invention along with its objectives and advantages, will be better understood from consideration of the following detailed description along with accompanying drawings in which:

FIG. 1 is a plan view of a carrier tray and associated vacuum structure of the invention, FIG. 2 is an end elevation view of the structures of FIG. 1 taken along lines II—II in FIG. 1, FIG. 3 is a side elevation view of the structures of FIG. 1 taken along lines III—III of FIG. 2., FIG. 4 is an enlarged sectional view of the portion of FIG. 1 taken along lines IV—IV of FIG. 1, FIG. 5 is a cross sectional view of the structures of FIG. 1 taken along lines V—V of FIG. 1, and FIG. 6 is an exploded view of the structures of FIGS. 1 to 5.

PREFERRED EMBODIMENTS

Referring now to the drawings, FIG. 1 thereof shows in plan view the structure of a carrier tray 10 designed to receive and transfer a fragile flexible item 12, illustrated in FIGS. 2, 4 and 5, such as a green ceramic card, from a first workstation, which may be the location of a table or bench structure 14 partially depicted in FIGS. 2, 3, 5 and 6, to a second location or workstation (not shown).

Tray 10 has an open center, designated by numeral 15 in FIG. 6, and is moved by a suitable conveying means (not shown) mechanically connected to a triangular shaped (truncated) integral extension 16 of the tray.

Mounted on the upper surface and along two opposed edges of the tray are four spaced apart clamps 18 for holding fragile item 12 to the upper surface of the tray. As shown in FIG. 1, two inner clamps are longer than two outer ones.

More particularly, each of the clamps 18 includes a flat integral jaw 22, the main body of each clamp being mounted on and secured to a rotatable shaft 24. One shaft extends through all four of the clamps on each edge of tray 10. Each shaft, in turn, is rotatably secured to the upper surface of the tray by an upstanding boss 26 located adjacent each end of each shaft and suitably secured to the tray.

Each clamping jaw 22 has a relatively soft layer 23 of cushioning material (see FIGS. 2, 4 and 5) suitably attached to the clamping surface of each jaw to protect fragile item 12 when it is clamped to the tray by the jaws. An enlarged, elevation view of one clamp jaw 22 is shown in FIG. 4 of the drawings.

Mounted on shafts 24 and between bosses 26 and the four clamp bodies 18 closest to the bosses are four cylinders 28 each containing a spring (not visible) that engage the shafts in a manner that maintains clamps 18 in a clamping position against the upper surface of the tray, i.e., when the shafts are rotated to rotate clamping jaws 22 away from the tray surface, the springs in cylinder 28 are compressed in a manner that stores energy in the springs such that when the shafts are released, the springs rotate (return) the shaft and clamps to the clamping posture.

Each shaft 24 is rotated by a suitable respective actuator 30, mounted on and secured to a vacuum platen structure 32 at a location on platen 32 opposite extension 16 of tray 10 when the tray is located on 32. The actuators can be electrically operated solenoids, though other actuating devices can be used.

The vacuum platen 32 is, in turn, located on and suitably secured to the upper surface of table 14 (FIGS. 2 to 6), and tray 10 is conveyed to and disposed on the platen to receive fragile item 12, as discussed in detail hereinafter. The ends of shafts 24 facing actuators 30, each have a collar 33 (FIGS. 1 and 3) provided with a slot 34 that receives the narrow end 36 of a shaft 38 extending from the actuator toward the collars. This is best seen in FIG. 1. When clamps 18 are closed on the upper surface of tray 10 or on item 12, the slots in collars 33 extend in a vertical direction. Similarly, when the actuators are not energized, the narrow dimension of shaft ends 36 also extend in a vertical direction. Thus, when the tray is lowered to platen 32, the narrow ends of shafts 38 receive the slotted ends of collars 33, as shown in FIG. 1.

Platen 32 has an open hollow center or cavity 40, as best seen in FIGS. 4 and 6, from which air is withdrawn, as explained below, in creating a vacuum in the cavity. The platen has a lower wall 41 that provides a planar surface 41A. Within the cavity of the platen are interior, intersecting wall portions 44. Wall portions 44 compartmentalize cavity area 40 of the platen (see FIGS. 1 and 6), as the wall portions extend laterally between the inside edges of the platen that define the cavity, vertically between the upwardly facing surface 41A of the platen and the downwardly facing surface 46 of a flat, perforated plate 48. This is best seen in FIGS. 2 and 5 of the drawings. Elastomer strips 42, as shown in FIG. 5 and cemented to the bottom surface of 44 (FIG. 6), provide an air-tight seal between lower edges of 44 and the bottom wall 41 of the cavity.

An elastomer strip 54 cemented to the top surface of 44 (FIG. 6) is also located between the upper edges of wall portions 44 (see cross section of 54 in FIG. 5) and the downwardly facing surface 46 (FIG. 4) of plate 48 to provide an air-tight seal between wall portions 44 and plate 48.

Wall portions 44 are sealed to the vertical cavity edges by a suitable adhesive compound not shown.

Perforated plate 48 is seated on and secured to the upper peripheral surface of platen 32 and on an elastomer (preferably Neopreme) O-ring 50 located in slot 52 provided in the upper surface of the platen. The slot extends continuously about cavity 40 of the platen, to receive 0-ring 50 in an uninterrupted manner, so that an air-tight seal is effected between plate 48 and the upper surface of the platen.

As shown in FIGS. 2, 5 and 6 of the drawings, table 14 is provided with an opening 56 through which a pipe or tube 58 extends. One end of tube 58 is threaded into an opening 60 provided in wall 41 of the platen, which opening is located in a central portion of 41 and cavity 40, as seen in the plan view of FIG. 1. The other end of the tube is connected to a pump (not shown) for drawing a vacuum in cavity 40.

As shown in FIG. 1, 2, 5 and 6, wall portions 44 in the cavity of the platen contain orifice inserts 62 that provide precisely dimensioned openings for a controlled flow of air from compartmental areas defined by the wall portions. As seen in the plan view of FIG. 1, and in perspective in FIG. 6, the wall portions form a central area and compartment 64, two peripheral, opposed, rectangular areas 66, located between extension 16 of tray 10 in FIG. 1 and actuators 30, and six peripheral compartments 68 (three on two opposed sides of the cavity) located along the extent of clamping jaws 22.

As further shown in the views of FIGS. 1 and 6, plate 48 is provided with rows of pin holes 70 that define a grid (in plan view) that overlays the grid defined by walls 44, the rows of pin holes being offset from the extent of walls 44. The pin holes thus extend over the open areas of compartments 64, 66 and 68, as defined by walls 44, and cross over the walls, as seen in FIG. 1. A cross section of one pin hole 70 is shown in FIG. 4.

As seen most clearly in FIGS. 4 and 6, the rows of pin holes 70 can be located in raised portions 72 of plate 48 that provide recesses 74 in the plate between the raised portions and a peripheral lower surface 73 located about raised portions 72. It is necessary to maintain the areas of card 12 that will receive metallization for circuit connections clean. Hence, the circuit areas of the card are those areas that lie over recesses 74 in plate 48 when the card is placed on tray 10 and on the plate, i.e., only raised portions 72 and the periphery of the tray contact the card, thereby keeping the card from contacting the plate in the recessed areas of 74 and thus from contacting any contaminating substances that may be on the recessed surfaces of the plate.

Tray 10 and the supporting apparatus of platen 32 and plate 48, as thus far described, function in the following manner. The tray is first moved by a supporting conveyor (not shown) to a location over platen 32 and table 14, and then vertically lowered to rest on the upper surface of the platen. The tray must be located over the platen in a manner that aligns the slotted ends 34 of collars 33 with the narrow ends 36 of actuator shafts 38. Platen 32 is provided with two upstanding tapered pins 75 (FIGS. 2, 3 and 4) that enter into two corresponding openings 76 provided in the tray and sized to receive the pins without excess tolerance between the OD of pins and ID of the openings. The pins and openings (75 and 76 respectively) align the periphery of tray 10 over the raise portion 72 of perforated plate 48 so that the tray sits down on the lower peripheral portion 73 (FIG. 6) of plate 48. The thicknesses of the tray and raised portions of the plate are the same (see FIG. 4) such that their upper surfaces are flush when fragile item 12 is placed thereon. At this time actuators 30 are not energized such that their shafts 38 are in a position that locates the narrow dimension 36 of the shafts in a vertical position. Similarly, when tray 10 is lowered to platen 32 and plate 48, the springs in cylinders 28 maintain clamping pins 22 in a closed, clamping position, and slots 34 of collars 33 in a vertical position. Hence, when the tray is lowered to the platen, slots 34 receive the narrow ends of shafts 38, as shown in FIG. 1.

Tray 10 is now in position to receive a fragile item or card 12 from a conveying device or end effector (not shown) carrying the card. Before such device or effector releases the card to the tray, solenoids 30 are operated to rotate their respective shafts 38, and thus collars 33 and shafts 24 of clamp bodies 18, to rotate clamping jaws 22 ninety degrees upwardly and away from the upper surface of the tray. This is shown in phantom in FIGS. 2 and 4. The clamping jaws are clear of the tray surface and the vertical path above the tray such that card 12 can descend to the tray. The operation of the means that conveys the tray to the location of the platen and of actuators 30 can be under the control of a suitable computer (not shown).

For example, the computer will know when the tray is in place on platen 32 and when the clamps are open to receive card 12 because it (the computer) orders positioning of the tray and the opening of the clamps. The computer then orders release of the card to the tray. After such release and receipt by the tray, the above vacuum pump is then ordered to evacuate cavity 40 of the platen to smooth the card on perforated plate 48 and tray 10 by pulling air through pin holes 70 in the plate.

The evacuation and smoothing of the card takes place in the following manner. The vacuum pump pulls air from cavity 40 through pipe 58, which extends into opening 60 in the lower wall 41 of the platen. Since opening 60 is located in center chamber 64 of the cavity and in the substantial center of 64, chamber 64 is the first portion of the cavity to receive the effects of air withdrawal through 60. If the walls 44 of the platen grid were merely provided with relatively large openings, as opposed to control orifices 62, all of the sections (chambers 64, 66 and 68) of cavity 40 would be essentially simultaneously evacuated. However, orifices 62 are sized to limit the flow of air from chambers 66 and 68, and through pin holes 70 over these chambers, such that center chamber 64 is evacuated first. The center of card 12 is thus pulled first against the center portion of plate 48. Thereafter, orifices 62 permit peripheral sections 66 and 68 to be gradually evacuated simultaneously such that the card is pulled against those portions of plate 48 overlying sections 66 and 68. In this manner, the smoothing of the card on plate 48 progresses outwardly from its center to its periphery so that the card is not bunkled or wringled in the smoothing process.

With the card properly smoothed and flattened on plate 48 and on the upper peripheral surface of tray 10, the computer senses the completion of the evacuation process and orders actuators 30 to close clamps 18 on the edges of the flattened card so that the card is clamped to the tray. The tray and card are now ready to be lifted from the platen and be moved to a next location or workstation (not shown). The cavity 40 is repressurized before the tray and card are moved so that a vacuum is now not present to retain the card. The flatness of the card is maintained by the clamps, and the integrity of the material of the card is sufficient to maintain its flat planar configuration over the open center of the tray while the card is being transported by the tray.

When the tray and card reach a location or station for removing the card from the tray, another set of actuators (not shown) can be so situated and employed to rotate clamp jaws 22 to a position that allows the card to be removed.

While the invention has been described in terms of preferred embodiments, the claims appended hereto are intended to encompass all embodiments which fall within the spirit of the invention.

What is claimed is:

1. A method of handling a fragile, flexible, green ceramic card and for transferring the card from one location to another location, comprising:
    disposing said card on a tray having an open area in the center portion of the tray,
    locating the tray with the card on a perforated plate located on a hollow platen containing intersecting walls that form center and peripheral compartments in said hollow platen,
    evacuating the center compartment in said hollow platen beneath the card to draw a center portion of the card against the plate,
    evacuating the peripheral compartments of said hollow platen to draw peripheral portions of the card to the plate such that the card is substantially flat,
    clamping opposed edges of the card against the tray,
    removing the vacuum from said compartments,
    moving the tray from the plate and the platen to another location, and
    unclamping the opposed edges of the card so that the card can be removed from the tray.

2. A method as set forth in claim 1 in which the card is rectangular or square in configuration, and the plate has relatively narrow raised surfaces that define recessed areas between said narrow raised surfaces.

* * * * *